(12) United States Patent
Fukuda et al.

(10) Patent No.: US 10,462,335 B2
(45) Date of Patent: Oct. 29, 2019

(54) VIDEO PROCESSING DEVICE

(71) Applicant: FUJITSU TEN LIMITED, Kobe-shi, Hyogo (JP)

(72) Inventors: Yasuhiro Fukuda, Kobe (JP); Yoshihiro Shimano, Kobe (JP)

(73) Assignee: FUJITSU TEN Limited, Kobe (JP)

( * ) Notice: Subject to any disclaimer, the term of this patent is extended or adjusted under 35 U.S.C. 154(b) by 169 days.

(21) Appl. No.: 15/627,756

(22) Filed: Jun. 20, 2017

(65) Prior Publication Data

US 2018/0063385 A1  Mar. 1, 2018

(30) Foreign Application Priority Data

Aug. 30, 2016 (JP) .................... 2016-167925

(51) Int. Cl.
*G09G 3/36* (2006.01)
*H04N 7/01* (2006.01)
(Continued)

(52) U.S. Cl.
CPC .............. *H04N 5/04* (2013.01); *G09G 3/36* (2013.01); *G09G 3/3611* (2013.01); *G09G 3/3614* (2013.01); *H04N 5/126* (2013.01); *H04N 5/14* (2013.01); *G09G 2310/0224* (2013.01); *G09G 2310/0227* (2013.01); *H03L 7/199* (2013.01); *H04N 7/012* (2013.01); *H04N 2005/91364* (2013.01)

(58) Field of Classification Search
CPC ...... G09G 3/3648; G09G 3/3614; G09G 3/36; G09G 2310/0224; G09G 2310/0227; G09G 2310/0229; G09G 2320/02; G09G 2320/0209; G09G 2320/103; H04N 5/04; H04N 7/012; H04N 5/91364
See application file for complete search history.

(56) References Cited

U.S. PATENT DOCUMENTS 4,985,770 A * 1/1991 Nagashima .......... G09G 3/2011
348/550
6,839,094 B2 * 1/2005 Tang ...................... H04N 7/012
348/441
(Continued)

FOREIGN PATENT DOCUMENTS

JP  2004-045741 A  2/2004
JP  2005-352190 A  12/2005
(Continued)

*Primary Examiner* — Dismery Mercedes
(74) *Attorney, Agent, or Firm* — Oliff PLC

(57) ABSTRACT

Provided is a video processing device that generates a display video signal to be supplied to a liquid crystal display having a liquid crystal that is driven by a frame inversion scheme and includes a control microcomputer and a video signal processor. The control microcomputer controls a data enable signal such that a display invalid section having a predetermined number of fields is set for an interlace video signal at a predetermined period based on a vertical synchronization signal included in the interlace video signal input from outside. The video signal processor generates the display video signal by setting the display invalid section for the interlace video signal based on the data enable signal and outputs the display video signal to the liquid crystal display.

15 Claims, 11 Drawing Sheets

(51) Int. Cl.
*H04N 5/04* (2006.01)
*H04N 5/12* (2006.01)
*H04N 5/14* (2006.01)
H04N 5/913 (2006.01)
H03L 7/199 (2006.01)

(56) References Cited

U.S. PATENT DOCUMENTS

| | | | |
|---|---|---|---|
| 9,613,580 B2 * | 4/2017 | Huang | G09G 3/3674 |
| 2003/0169247 A1 * | 9/2003 | Kawabe | G09G 3/342 |
| | | | 345/204 |
| 2006/0066504 A1 * | 3/2006 | Sampsell | G09G 3/3466 |
| | | | 345/1.1 |
| 2007/0229447 A1 * | 10/2007 | Takahara | G09G 3/3406 |
| | | | 345/102 |
| 2010/0277463 A1 * | 11/2010 | Yen | G09G 3/20 |
| | | | 345/213 |
| 2012/0268431 A1 * | 10/2012 | Kitamura | G09G 3/2096 |
| | | | 345/204 |
| 2013/0169618 A1 * | 7/2013 | Kobayashi | G09G 5/10 |
| | | | 345/212 |
| 2014/0002431 A1 * | 1/2014 | Shibata | G09G 3/3614 |
| | | | 345/208 |
| 2014/0362073 A1 * | 12/2014 | Huang | G09G 3/3674 |
| | | | 345/213 |
| 2016/0012791 A1 * | 1/2016 | Hsieh | G09G 3/3648 |
| | | | 345/98 |
| 2016/0212415 A1 * | 7/2016 | Cho | G02B 27/2214 |
| 2018/0176504 A1 * | 6/2018 | Matsumoto | G09G 3/2096 |

FOREIGN PATENT DOCUMENTS

| | | |
|---|---|---|
| JP | 2009-037209 A | 2/2009 |
| JP | 2009-122364 A | 6/2009 |

* cited by examiner

VIDEO PROCESSING DEVICE

BACKGROUND OF THE INVENTION

Field of the Invention

The present invention relates to a video processing device.

Description of the Background Art

In the related art, a liquid crystal display (in the following, referred to as "IPS liquid crystal") in which an in plane switching (IPS) method is adopted is known. Such an IPS liquid crystal is excellent in view angle characteristics and thus, is used as a display device for various scenes such as a wide screen, a large screen, a portable terminal screen, and a screen for an on-vehicle device.

However, in the related art described above, there is still room for improvement on efficient prevention of a residual image phenomenon.

Specifically, the IPS liquid crystal has a problem that a residual video characteristic is weak and especially, when an interlace video is displayed, a residual video becomes easy to occur in a specific image. For example, although the residual image phenomenon is generated due to occurrence of charge accumulation caused by impurities contained in a liquid crystal layer by a video signal of a specific image, in a case of a non-interlace video, such charge accumulation is eliminated by polarity inversion of a thin film transistor (TFT) electrode of each frame conducted in general liquid crystal display of an active matrix driving type.

However, in a case of the interlace video, one frame is constituted with two fields of an odd-numbered field and an even-numbered field and thus, the video signal of the specific image becomes different between such fields and charge accumulation cannot be eliminated by the above-described polarity inversion. Especially, in a case where a white solid image and a black solid image of which boundaries extend in the field direction, lines (for example, black in the odd-numbered field and white in the even-numbered field) in which polarities are turned to opposite polarities in the odd-numbered field and the even-numbered field may be generated at those boundaries and in this case, a situation that charge accumulation by polarity inversion becomes easy to occur.

SUMMARY OF THE INVENTION

According to an aspect of the present invention, there is provided a video processing device that generates a display video signal to be supplied to a liquid crystal display having a liquid crystal that is driven by a frame inversion scheme and includes a control microcomputer and a video signal processor. The control microcomputer controls a data enable signal such that a display invalid section having a predetermined number of fields is set for an interlace video signal at a predetermined period based on a vertical synchronization signal included in the interlace video signal input from outside. The video signal processor generates the display video signal by setting the display invalid section for the interlace video signal based on the data enable signal and outputs the display video signal to the liquid crystal display.

It is possible to efficiently prevent the residual image phenomenon.

According to another aspect of the present invention, the video processing device further includes a temperature detector that detects a temperature of the liquid crystal display. The control microcomputer adjusts the predetermined period based on a detection result of the temperature detector.

It is possible to suitably prevent the residual image phenomenon while adapting to temperature change. That is, it is possible to more efficiently prevent the residual image phenomenon.

Therefore, an object of the present inventions is to efficiently prevent the residual image phenomenon.

These and other objects, features, aspects and advantages of the present invention will become more apparent from the following detailed description of the present invention when taken in conjunction with the accompanying drawings.

DESCRIPTION OF THE EMBODIMENTS

In the following, embodiments of a video processing device, a video display system, and a video processing method disclosed in the present application will be described in detail with reference to the accompanying drawings. The present invention is not limited to the embodiments described in the following.

In the following, description will be made on a case where a "liquid crystal display unit" which is a liquid crystal module is an IPS liquid crystal and is used as an on-vehicle device by way of an example. In the following, a "data enable signal" which is a display valid instruction signal for a liquid crystal driving driver IC may be described as a "DE signal".

In the following, after description is made on an outline of the video processing method according to the present embodiment using FIG. 1A to FIG. 1F, description will be made on a video processing device 10 of a video display system 1 to which the video processing method according to an embodiment is applied using FIG. 2A to FIG. 7B.

First, description will be made on an outline of the video processing method according to the present embodiment using FIG. 1A to FIG. 1F. FIG. 1A to FIG. 1F are outline explanation diagrams (first to sixth diagrams) of the video processing method according to the embodiment.

Figure 1A:
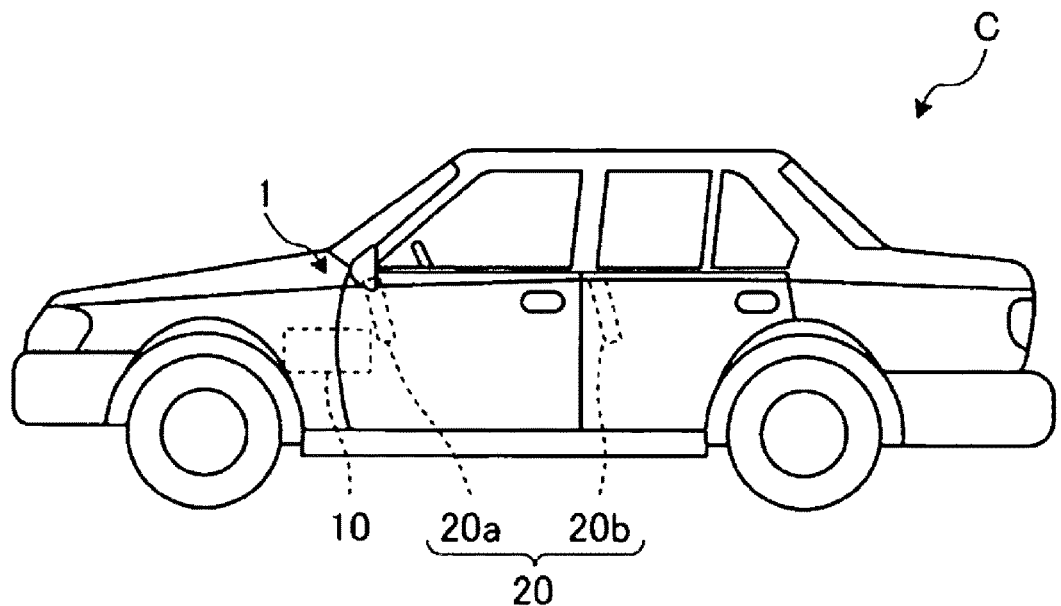
FIG. 1A is an outline explanation diagram (first) of a video processing method according to an embodiment.

As illustrated in FIG. 1A, the video display system 1 according to the present embodiment can be used by being mounted on, for example, a vehicle C. The video display system 1 includes the video processing device 10 and a liquid crystal display unit 20. The liquid crystal display unit 20 includes, for example, a first display unit 20a and a second display unit 20b.

The first display unit 20a is one for, for example, a display audio (in the following, referred to as "DA") installed at the front of a front seat or the like and the second display unit 20b is one for, for example, a rear seat entertainment system (in the following, referred to as "RSE") installed at a rear surface of the front seat or the like. The first display unit 20a can display, for example, a monitoring video from an on-vehicle camera (not illustrated). The second display unit 20b can display, for example, a video of a DVD player, a game video, or the like.

The video processing device 10 receives a video signal from various video sources, conducts video processing on such a video signal to be capable of being displayed on the liquid crystal display unit 20, and outputs the video signal to the liquid crystal display unit 20.

In the meantime, when a liquid crystal is driven with DC in liquid crystal display of a general active matrix drive type, the lifetime is shortened and thus, liquid crystal driving is performed by a frame inversion scheme in which AC is applied so as to inverse polarities of respective electrodes which become sub-pixels per one image (frame).

Figure 1B:
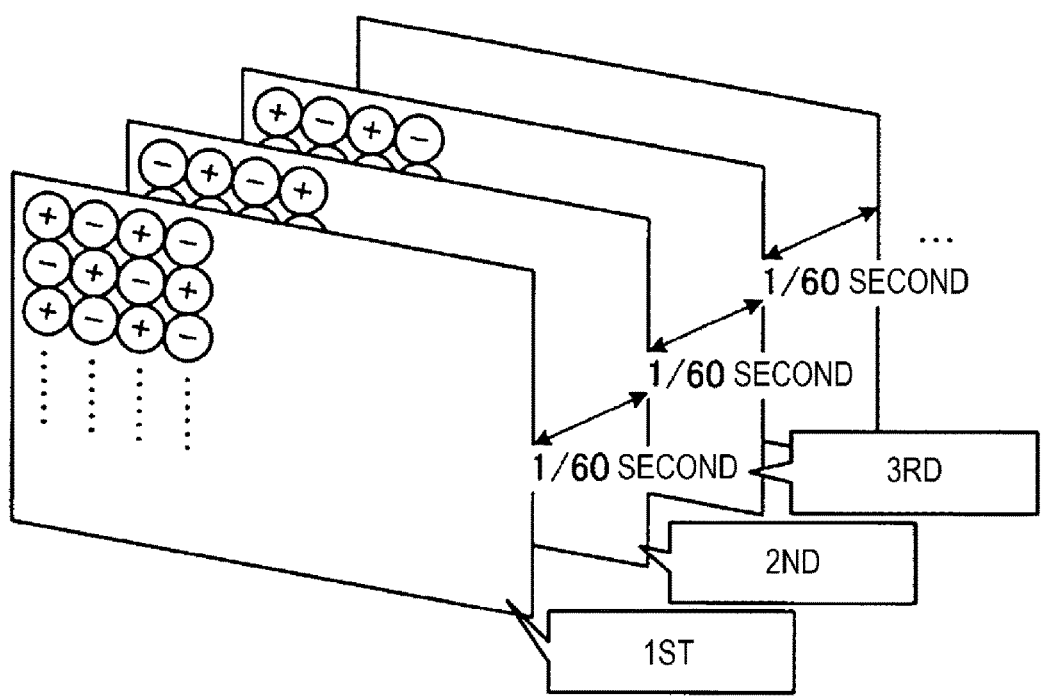
FIG. 1B is the outline explanation diagram (second) of the video processing method according to the embodiment.

For example, a dot matrix inversion drive type among the frame inversion scheme is exemplified in FIG. 1B. In the dot matrix inversion drive system, as illustrated in FIG. 1B, for example, at 1/60 second intervals (that is, 60 Hz), one sub-pixel for each frame of a first, second, and a third frame . . . is alternated to inverse a positive pole and a negative pole of the electrode.

Figure 1C:
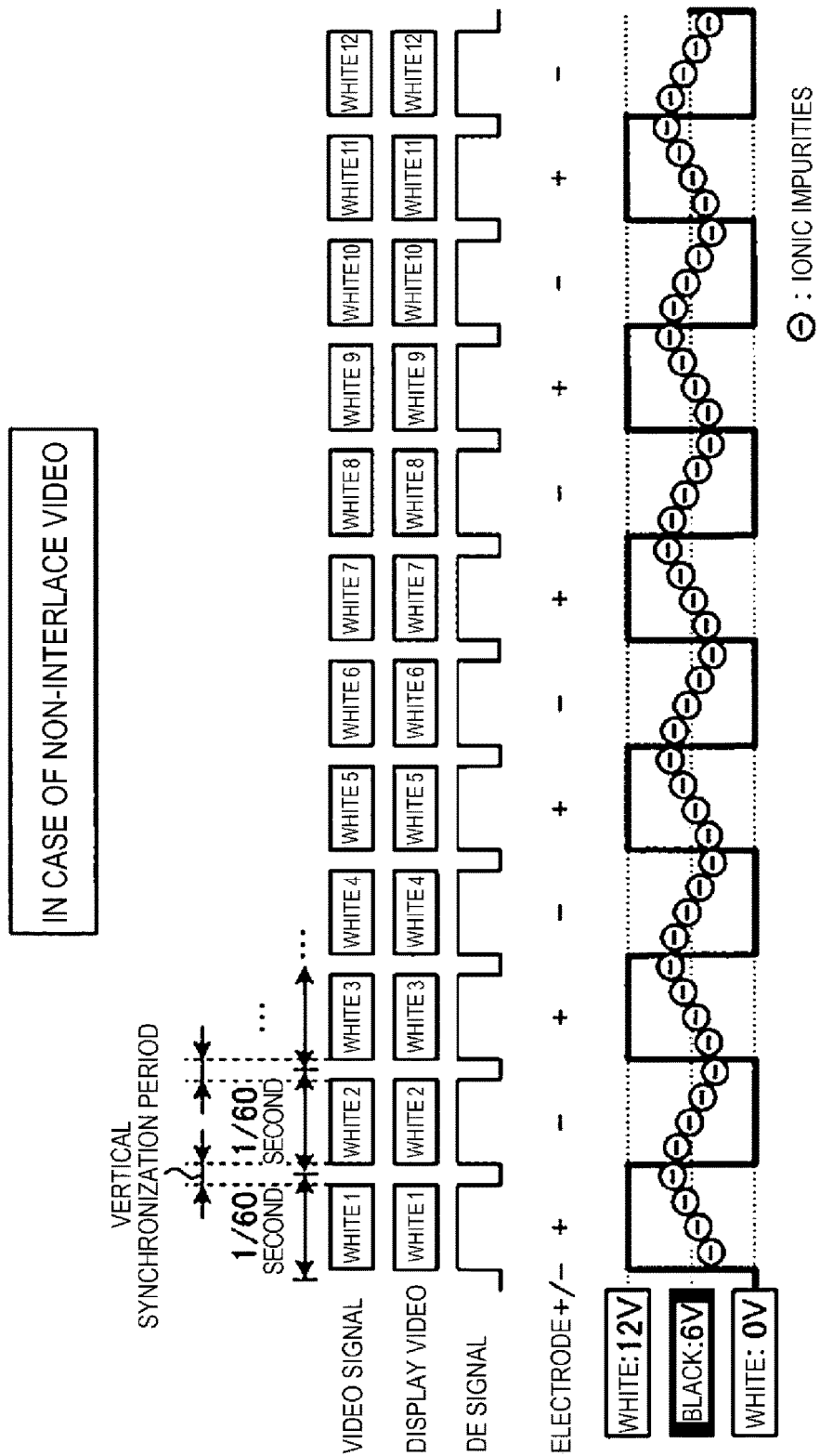
FIG. 1C is the outline explanation diagram (third) of the video processing method according to the embodiment.

With this, for example, as illustrated in FIG. 1C, in a case of a non-interlace video, even when the same video signal (for example, white 1 to white 12) is inputted between frames for a certain sub-pixel, ionic impurities can be made to exist in the liquid crystal layer without being unevenly distributed, by the influence of the polarity inverted for each frame. That is, the frame inversion scheme has effects of eliminating charge accumulation of the ionic impurities within the liquid crystal layer and preventing the residual image phenomenon.

As illustrated in FIG. 1C, frames are separated by a vertical synchronization period by a vertical synchronization signal. The DE signal is normally subjected to off/on control in the vertical synchronization period and a display invalid section corresponding to the vertical synchronization period is set for the display video.

Figure 1D:
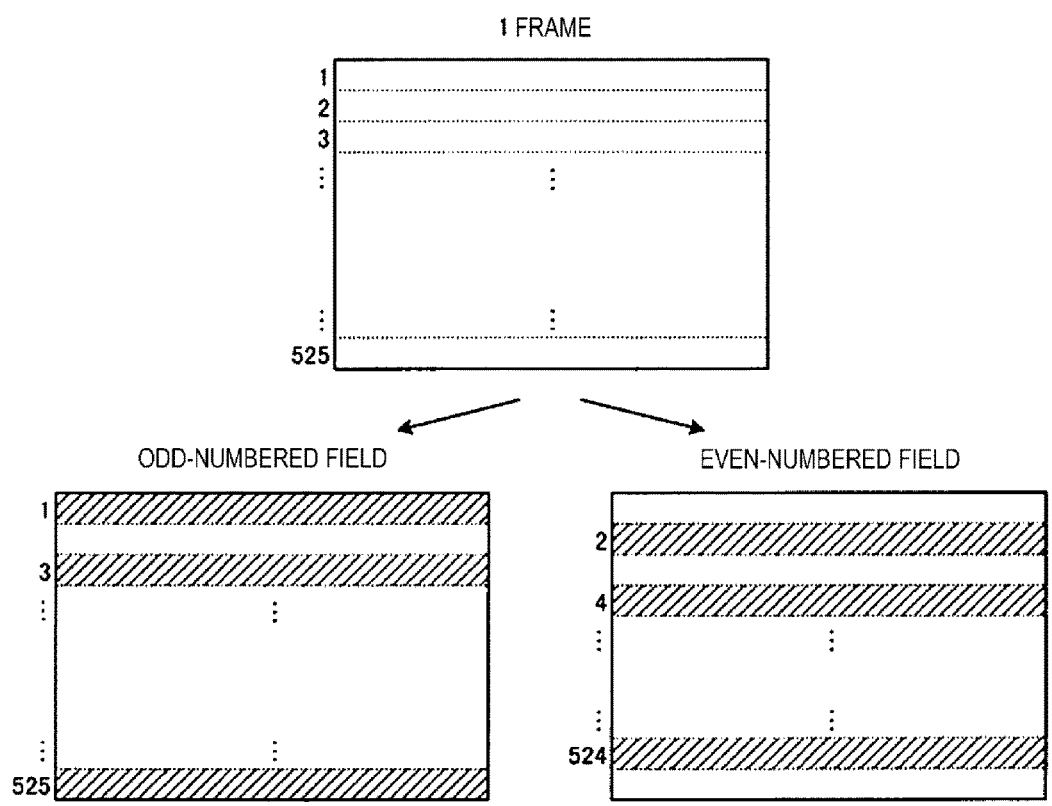
FIG. 1D is the outline explanation diagram (fourth) of the video processing method according to the embodiment.

However, here, a case of an interlace video is considered. One frame is assumed as 525 rows. As illustrated in FIG. 1D, in a case of the interlace video, one frame is constituted with two fields of an odd-numbered field formed with only scanning lines of odd-numbered rows and an even-numbered field formed with only scanning lines of even-numbered rows. Such two fields are alternately displayed and thus, even though the video signals of a specific image are the same from a frame unit point of view, the video signals easily become different between fields.

Figure 1E:
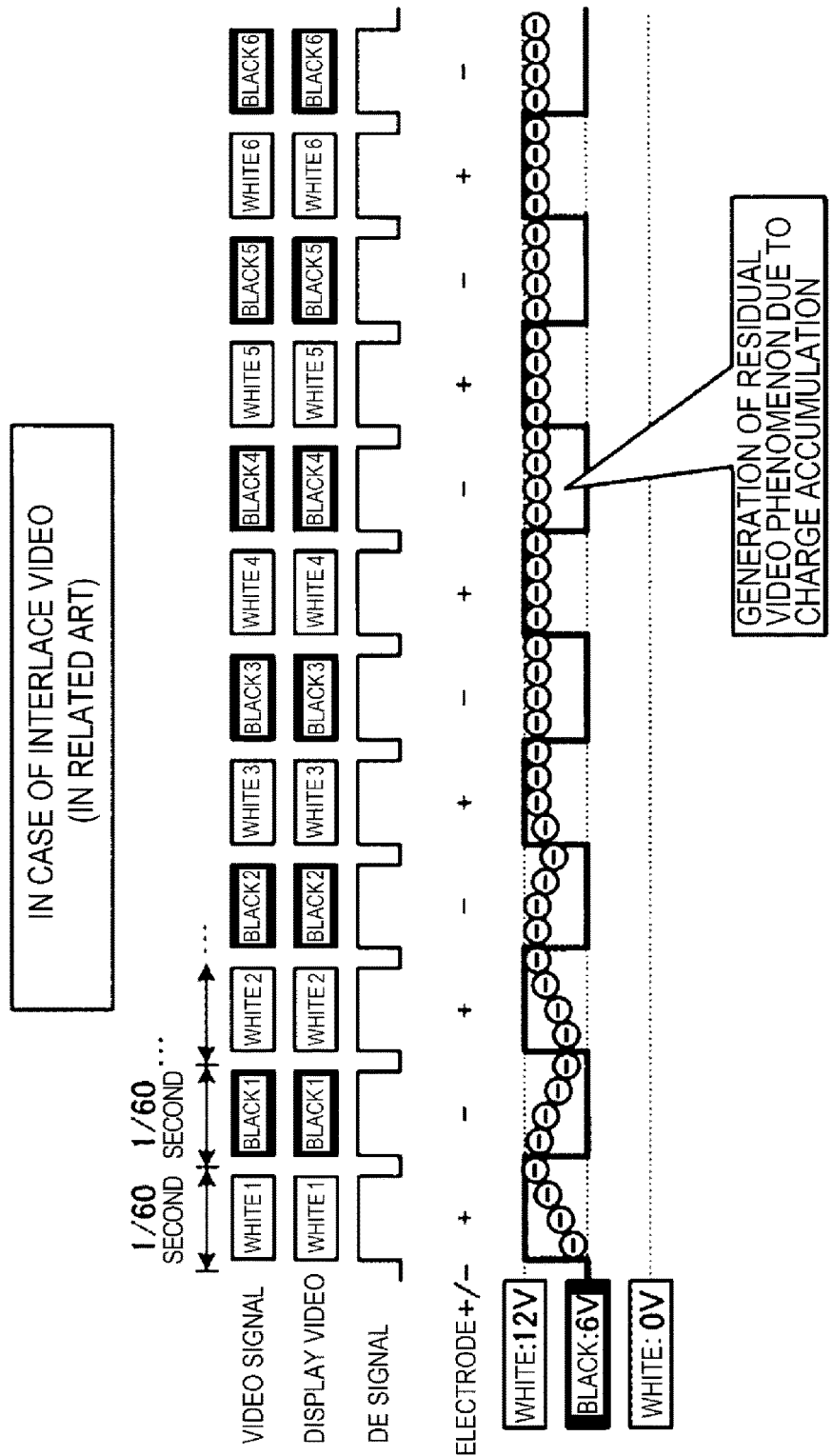
FIG. 1E is the outline explanation diagram (fifth) of the video processing method according to the embodiment.

In order to make easy to understand description, a case where white and black are replaced for each field is exemplified. As illustrated in FIG. 1E, in a case where such an interlace video is displayed by the method of the related art, since deviation of potential of white and black for each field is small, ionic impurities are easily distributed unevenly in the same direction and "generation of residual image phenomenon due to charge accumulation" easily occurs. In a case of the IPS liquid crystal, ionic impurities may become difficult to move due to a positional relationship between a common electrode and respective electrodes of sub-pixels and the tendency of generation of residual image phenomenon due to charge accumulation is particularly strong.

Here, although matters that charge accumulation is eliminated by directly controlling the polarity of the electrode may be considered, in the present situation, a liquid crystal module in which a liquid crystal panel and a liquid crystal driving driver IC are integrated is mainly used for the liquid crystal display unit 20 and thus, it is thought that there is little realizability.

Figure 1F:
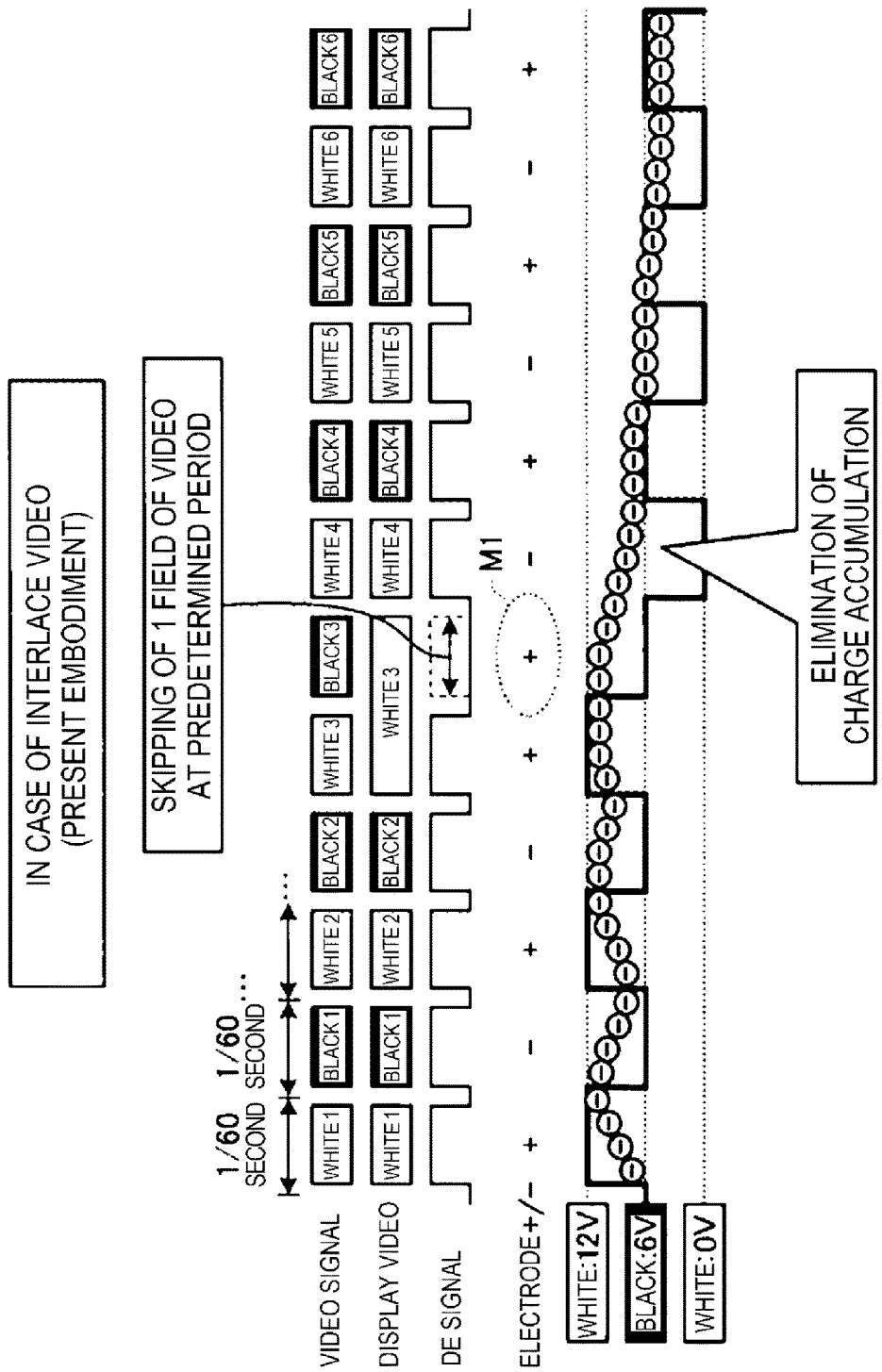
FIG. 1F is the outline explanation diagram (sixth) of the video processing method according to the embodiment.

Here, as illustrated in FIG. 1F, in the present embodiment, it is assumed that in a case of the interlace video, the video processing device 10 performs "skipping of a video of one field at a predetermined period" to thereby inverse the polarity of the electrode (see a portion surrounded by a closed curve M1 of a broken line in the figure).

Specifically, the video processing device 10 controls the DE signal such that the display invalid section of one field is set for the interlace video signal at a predetermined period based on the vertical synchronization signal included in the interlace video signal inputted from outside to thereby cause the video to be skipped.

For example, in the example illustrated in FIG. 1F, a display invalid period during which the "black 3" of the video signal is not displayed as the "black 3" in the display video is set in the display video signal. With this, the "white 3" of the preceding field is continuously displayed, the polarity to be corresponded to the "black 3" is inversed to "+", and potential of the succeeding "white 4" is turned to the negative pole of the electrode, "elimination of charge accumulation" of ionic impurities is possible. Accordingly, it is possible to efficiently prevent the residual image phenomenon.

As such, in the video processing method according to the present embodiment, the DE signal is controlled such that the display invalid section of one field is set for the interlace video signal at a predetermined period based on the vertical synchronization signal included in the interlace video signal inputted from outside. In the video processing method according to the present embodiment, the display video signal obtained by setting the display invalid section for the interlace video signal is generated based on such a DE signal and such a display video signal is output to the liquid crystal display unit 20.

Accordingly, according to the video processing method according to the present embodiment, it is possible to eliminate charge accumulation of ionic impurities and efficiently prevent the residual image phenomenon even for the interlace video.

In the following, the video processing device 10 of the video display system 1 to which the video processing method described above is applied will be described in further detail. In the following, description of the first embodiment using FIG. 2A to FIG. 5, description of the second embodiment using FIG. 6, and description of the third embodiment using FIG. 7A and FIG. 7B will be sequentially made.

First Embodiment

Figure 2A:
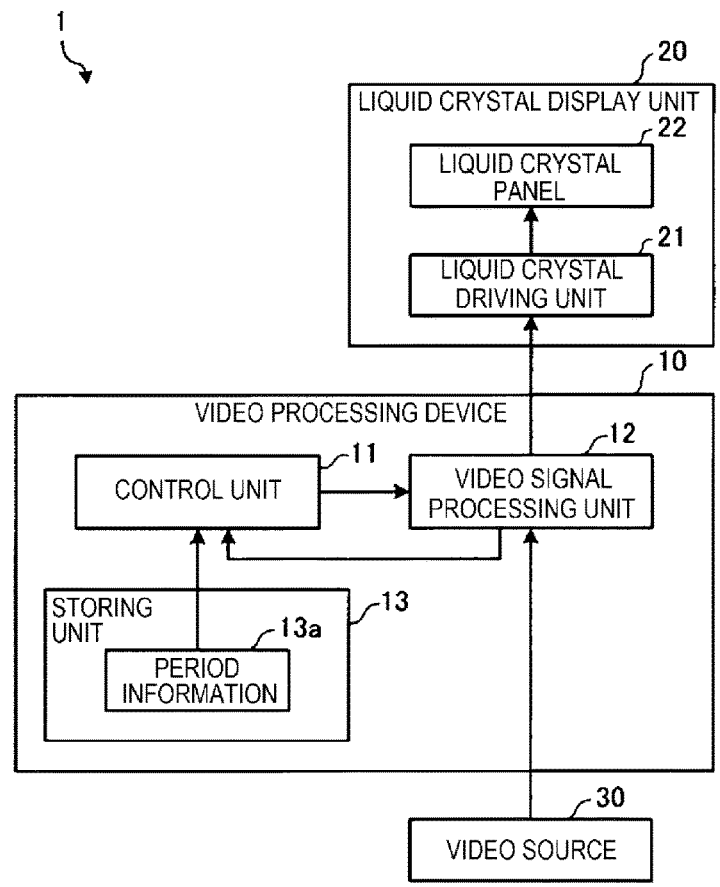
FIG. 2A is a block diagram of a video display system according to a first embodiment.
Figure 2B:
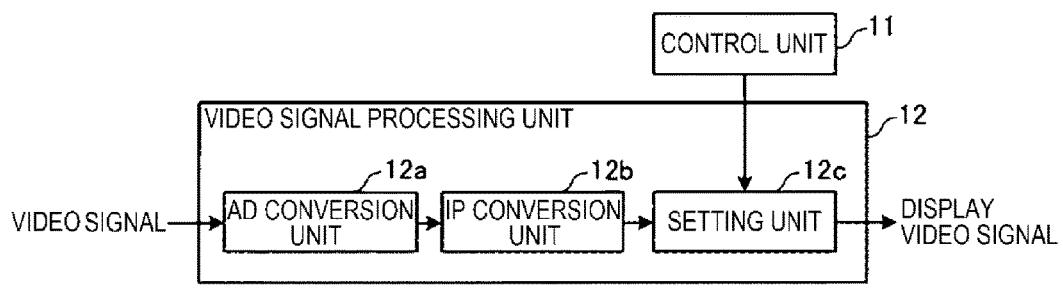
FIG. 2B is a block diagram of a video signal processing unit according to the first embodiment.

FIG. 2A is a block diagram of the video display system 1 according to the first embodiment. FIG. 2B is a block diagram of a video signal processing unit 12 according to the first embodiment.

In FIG. 2A and FIG. 2B, only constitutional elements necessary to describe characteristics of the present embodiment are represented by functional block diagrams and description of general constitutional elements is omitted.

In other words, constitutional elements illustrated in FIG. 2A and FIG. 2B are functional and conceptual ones and do not necessarily have to be physically configured as illustrated. For example, a specific form of distribution or integration of respective functional blocks is not limited to one illustrated and can be configured by functionally or physically distributing or integrating all or some of the functional blocks in an arbitrary unit according to various loads, use situations, or the like. This point is also the same for a block diagram (FIG. 6) which will be indicated later other than FIG. 2A and FIG. 2B.

First, as illustrated in FIG. 2A, the video display system 1 includes the video processing device 10, the liquid crystal display unit 20, and a video source 30. The liquid crystal display unit 20 corresponds to the liquid crystal module as previously described and includes a liquid crystal driving unit 21 corresponding to a liquid crystal driving driver IC and a liquid crystal panel 22. The video source 30 is, for example, an on-vehicle camera or a DVD player corresponding to various video sources.

The video processing device 10 includes a control unit 11, the video signal processing unit 12, and a storing unit 13. The storing unit 13 is a storing device called a hard disk drive, a nonvolatile memory, or a resister and stores period information 13a.

The period information 13a is information relating to a predetermined period used for skipping a video and a period of time, during which at least the residual image phenomenon does not occur, or the like is pre-specified and pre-registered.

The control unit 11 controls video signal processing by the video signal processing unit 12. The control unit 11 is configured by, for example, a control microcomputer.

Specifically, the control unit 11 monitors a vertical synchronization signal contained in a video signal acquired by the video signal processing unit 12 from the video source 30 at any time. The control unit 11 measures the predetermined period based on the period information 13a at any time. The measurement method may be, for example, a method by timer control or, for example, a method based on the number of processed frames or the number of processed fields.

In a case where a predetermined period arrives, the control unit 11 performs off/on control on the DE signal such that the display invalid section is set for one field of the interlace video signal based on a first vertical synchronization period first appearing from such an arrival of the predetermined period and a second vertical synchronization period appearing next to the first vertical synchronization period.

In off control of the DE signal, the notification of control to turn off the DE signal is sent to the video signal processing unit 12. On the other hand, in on control of the DE signal, the notification of control to turn on the DE signal is sent to the video signal processing unit 12.

The video signal processing unit 12 generates a display video signal based on a video signal from the video source 30 and control of the control unit 11 and outputs the generated display video signal to the liquid crystal display unit 20.

Specifically, as illustrated in FIG. 2B, the video signal processing unit 12 includes an AD conversion unit 12a, an IP conversion unit 12b, and a setting unit 12c. The AD conversion unit 12a performs analog-to-digital conversion processing on the input video signal.

In a case where a video signal digitized by the AD conversion unit 12a is an interlace video signal, the IP conversion unit 12b performs IP conversion processing which converts such an interlace video signal to a non-interlace video signal, that is, signal corresponding to a progressive video signal.

Figure 3:
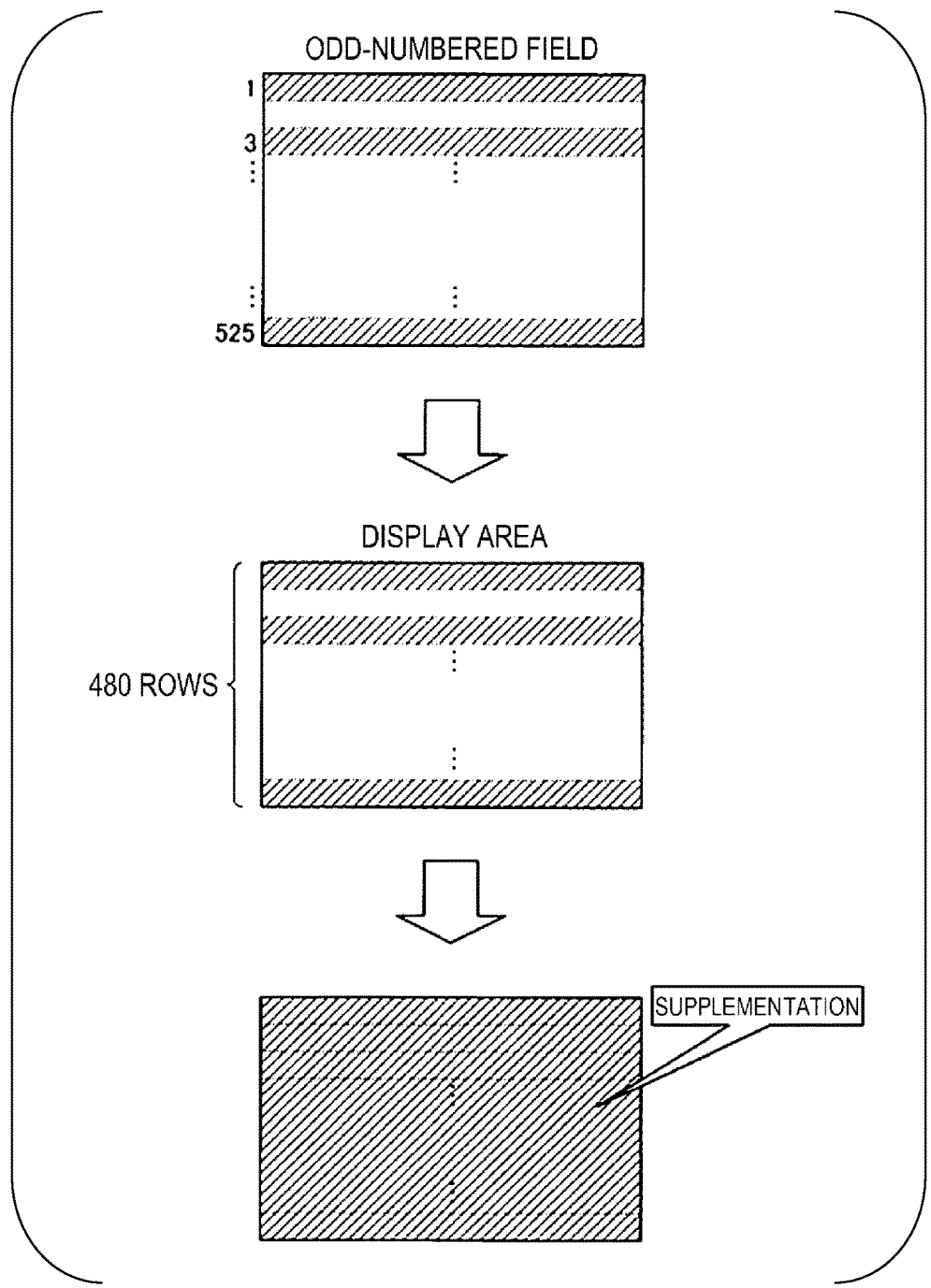
FIG. 3 is a processing explanation diagram of IP conversion processing.

Here, IP conversion processing by the IP conversion unit 12b will be described using FIG. 3. FIG. 3 is a processing explanation diagram of IP conversion processing. In FIG. 3, although the odd-numbered field in the interlace video signal is exemplified, it is also the same for the even-numbered field.

Although description is made in the above, as illustrated in FIG. 3, the odd-numbered field is formed with only scanning lines of odd-numbered rows, but, for example, it is assumed that in a case where one frame is configured with 525 rows, the number of rows of the odd-numbered field becomes 263 rows.

On the other hand, for example, in a case where a display area of the liquid crystal panel 22 is 480 rows as illustrated in an intermediate stage of FIG. 3, some of (for example, upper portion, lower portion, or the like) 263 rows of the odd-numbered field need to be thinned so as to be fallen within one half of such 480 rows, that is 240 rows. The IP conversion unit 12b performs such processing.

As illustrated in the intermediate stage of FIG. 3, an empty portion is caused at an area corresponding to the even-numbered field not just for 240 rows of the odd-numbered field. As illustrated in the lower stage of FIG. 3, the IP conversion unit 12b performs processing for supplementing the empty area based on 240 rows of the odd-numbered field. Such supplementation can be performed by, for example, enlarging respective rows of the odd-numbered field.

Although the IP conversion can be performed by accumulating the odd-numbered field and the even-numbered field on a frame memory to be combined, such a method is not daringly used in the present embodiment.

Referring back to description of FIG. 2B, description of the setting unit 12c will be followed. The setting unit 12c generates the display video signal to the liquid crystal display unit 20 based on the video signal from the IP conversion unit 12b and control from the control unit 11 and outputs the display video signal to the liquid crystal display unit 20.

For example, in a case where the notification of off control and the notification of on control of the DE signal are received from the control unit 11, the setting unit 12c sets the display invalid section for the video signal during a period of time spanning from the time at which the notification of off control is received to the time at which notification of on control is received. The display invalid section is set regardless of whether the video signal is the interlace signal or the non-interlace signal.

Figure 4:
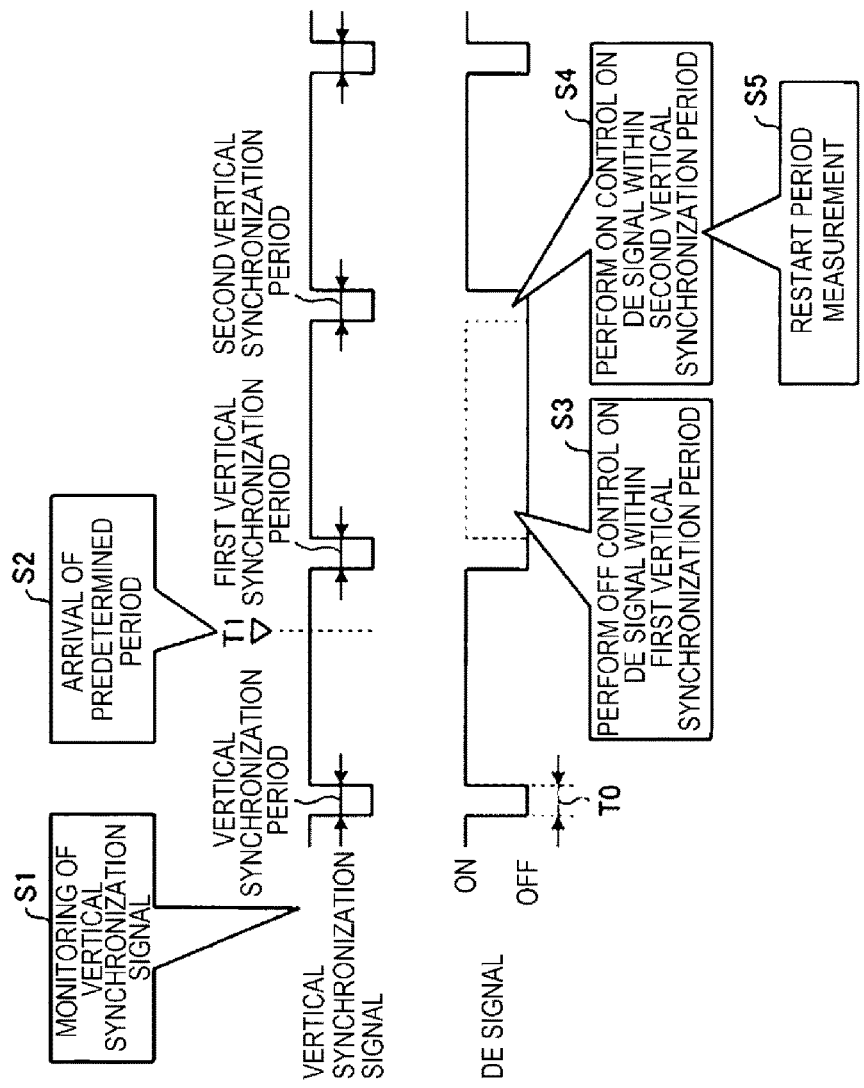
FIG. 4 is a processing explanation diagram of video skipping processing.

Here, video skipping processing in a case where the video signal is the interlace video signal will be described more specifically using FIG. 4. FIG. 4 is a processing explanation diagram of video skipping processing.

As illustrated in FIG. 4, the control unit 11 monitors the vertical synchronization signal at all times (Step S1). The control unit 11 also performs predetermined period measurement.

Then, the control unit 11 performs, for example, normal off/on control of the DE signal for the vertical synchronization period at a period of time T0 corresponding to the vertical synchronization period until the predetermined period arrives. The setting unit 12c sets a normal display invalid section according to such off/on control.

Here, it is assumed that the predetermined period arrived at time T1 (Step S2). The control unit 11 sets a vertical synchronization period first appearing from such an arrival of the predetermined period as the first vertical synchronization period and performs off control on the DE signal within the first vertical synchronization period (Step S3). The setting unit 12c continuously sets the display invalid section for the interlace video signal from the time at which the notification of such off control is received.

The control unit 11 sets a vertical synchronization period appearing next to the first vertical synchronization period as the second vertical synchronization period and performs on control on the DE signal within such a second vertical synchronization period (Step S4). When such notification of on control is received, the setting unit 12c releases setting of the display invalid section performed on the interlace video signal.

After conducting Step S4, the control unit 11 restarts the predetermined period measurement (Step S5). Restarting referred to herein is restarting performed from an initial value. With this, video skipping processing is completed in one predetermined period. Such video skipping processing is repeated whenever the period arrives.

In a case where the video signal is the non-interlace video signal, normal off/on control of the DE signal illustrated using the period of time T0 is performed in FIG. 4. that is, in a case of the non-interlace video signal in which the residual image phenomenon is originally hard to occur, it is possible to perform video display in which the video quality is maintained while reducing a system load by avoiding useless video skipping processing.

Figure 5:
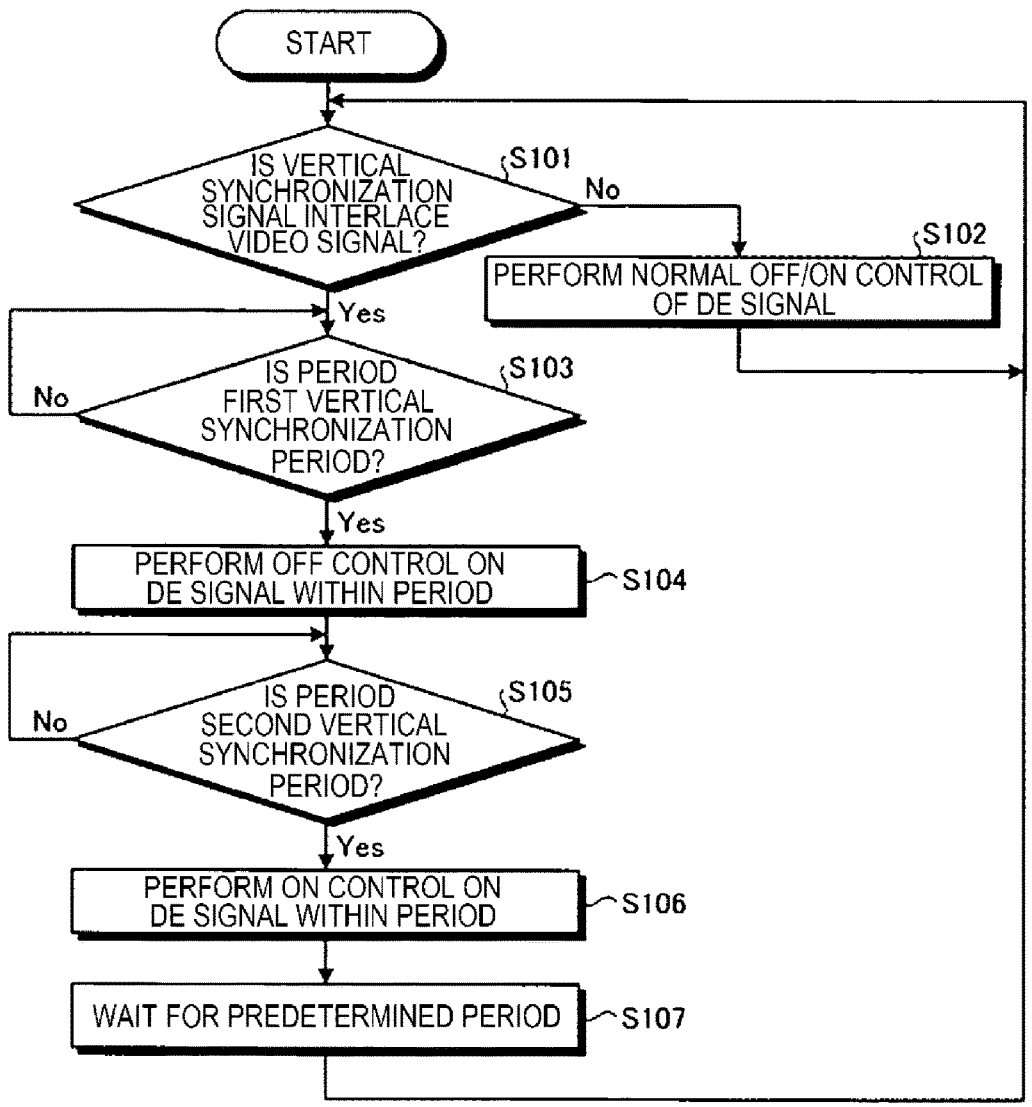
FIG. 5 is a flowchart illustrating a procedural sequence executed by a control unit of a video processing device according to the first embodiment.

Next, a procedural sequence executed by the control unit 11 of the video processing device 10 according to the first embodiment will be described using FIG. 5. FIG. 5 is a flowchart illustrating a procedural sequence executed by the control unit 11 of the video processing device 10 according to the first embodiment. Although the procedural sequence illustrated in FIG. 5 has a loop structure, inclusion of the loop structure represents that the control unit 11 monitors the vertical synchronization signal included in the video signal at all times.

First, the control unit 11 determines whether the monitored vertical synchronization signal is the interlace video signal or not (Step S101). Here, in a case where the monitored vertical synchronization signal is not the interlace video signal (No in Step S101), the control unit 11 performs normal off/on control of the DE signal (Step S102) and repeats processing starting from Step S101.

On the other hand, in a case where the monitored vertical synchronization signal is the interlace video signal (Yes in Step S101), the control unit 11 determines whether it is the first vertical synchronization period or not (Step S103). In a case where it is the first vertical synchronization period (Yes in Step S103), the control unit 11 performs off control on the DE signal within the first vertical synchronization period (Step S104).

On the other hand, in a case where it is not the first vertical synchronization period (No in Step S103), the control unit 11 repeats processing starting from Step S103.

Subsequently, the control unit 11 determines whether it is the second vertical synchronization period or not (Step S105). In a case where it is the second vertical synchronization period (Yes in Step S105), the control unit 11 performs on control on the DE signal within the second vertical synchronization period (Step S106). With this, video skipping for one field is performed in the interlace video signal.

The control unit 11 enters a state of waiting a predetermined period (Step S107) and then, repeats processing starting from Step S101.

As having been described above, the video processing device 10 according to the first embodiment is the video processing device 10 which generates the display video signal to the liquid crystal display unit 20 of which a liquid crystal is driven by the frame inversion scheme and includes the control unit 11 and the video signal processing unit 12.

The control unit 11 controls the data enable signal to set the display invalid section of one field for the interlace video signal at a predetermined period based on the vertical synchronization signal included in the interlace video signal inputted from outside. The video signal processing unit 12 generates the display video signal obtained by setting the display invalid section for the interlace video signal based on the data enable signal and outputs the display video signal to the liquid crystal display unit 20.

Accordingly, according to the video processing device 10 according to the first embodiment, it is possible to efficiently prevent the residual image phenomenon.

Second Embodiment

Next, a second embodiment will be described. In the second embodiment, portions different from those of the first embodiment will be mainly described and description of portions of which contents are duplicated will be omitted.

Figure 6:
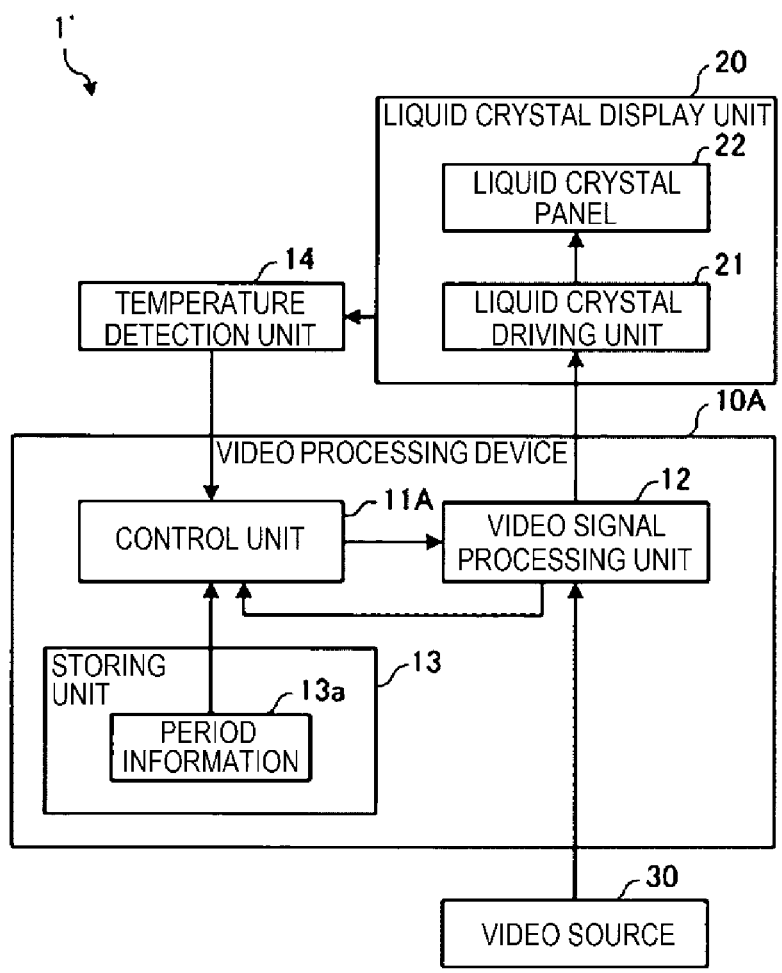
FIG. 6 is a block diagram of a video display system according to a second embodiment.

FIG. 6 is a block diagram of a video display system 1' according to the second embodiment. FIG. 6 corresponds to FIG. 2A and the second embodiment is different from the first embodiment in that a video processing device 10A further includes a temperature detection unit 14 communicably connected to a control unit 11A in the video display system 1' according to the second embodiment.

The second embodiment is different from the first embodiment in that the control unit 11A is able to rewrite the period information 13a.

The temperature detection unit 14 is a detection device detecting a temperature of the liquid crystal display unit 20. The control unit 11A adjusts the predetermined period included in the period information 13a based on a detection result of such temperature detection unit 14.

For example, the control unit 11A adjusts the period such that the predetermined period is gradually shortened as the temperature of the liquid crystal display unit 20 detected by the temperature detection unit 14 is increased. This is because occurrence of the residual image phenomenon becomes easier as the temperature is increased. As such, it is possible to suitably prevent the residual image phenomenon while adapting to temperature change by shorten intervals of the periods and increasing the number of times of video skipping as the occurrence frequency of the residual image phenomenon is increased. That is, it is possible to more efficiently prevent the residual image phenomenon.

As such, the video processing device 10A according to the second embodiment further includes the temperature detection unit 14 detecting the temperature of the liquid crystal display unit 20. The control unit 11A adjusts the predetermined period included in the period information 13a based on the detection result of the temperature detection unit 14. The control unit 11A adjusts the predetermined period to gradually shortened as the detected temperature increases.

Accordingly, it is possible to more efficiently prevent the residual image phenomenon according to the video processing device 10A according to the second embodiment.

Third Embodiment

Next, a third embodiment will be described. Also, in the third embodiment, portions different from those of the first embodiment and second embodiment will be mainly described and description of portions of which contents are duplicated will be omitted. The third embodiment is another form of adjustment processing (in the following, referred to as a "period adjustment processing") of the period information 13a described in the second embodiment.

Figure 7A:
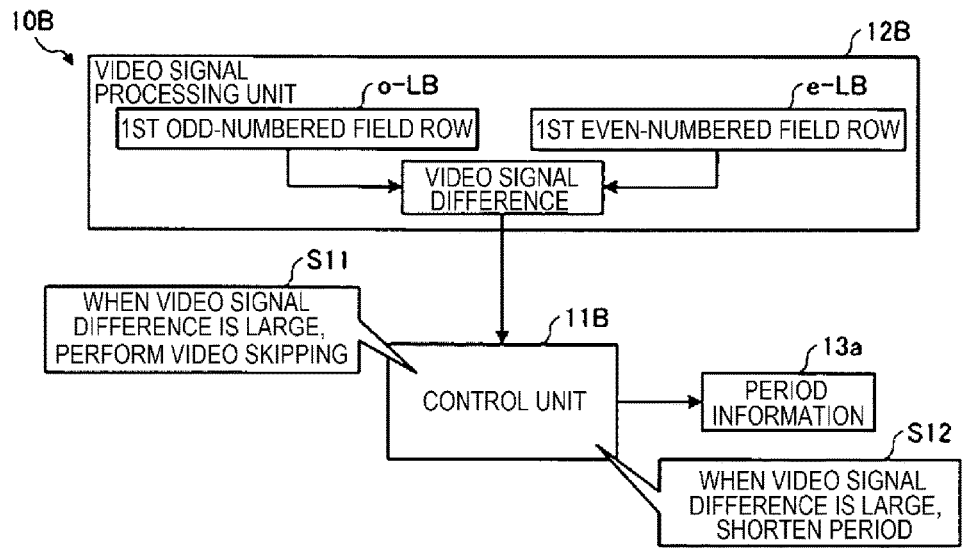
FIG. 7A is a processing explanation diagram of period adjustment processing according to a third embodiment.
Figure 7B:
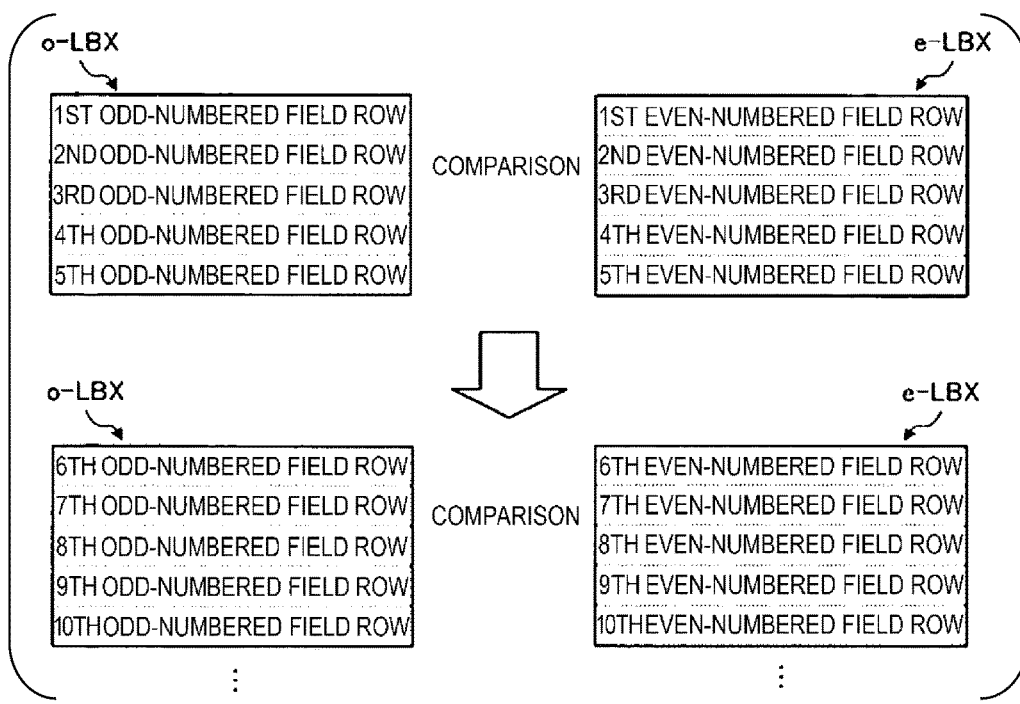
FIG. 7B is a diagram illustrating a modification example of the period adjustment processing according to the third embodiment.

FIG. 7A is a processing explanation diagram of period adjustment processing according to the third embodiment. FIG. 7B is a diagram illustrating a modification example of period adjustment processing according to the third embodiment.

As illustrated in FIG. 7A, the third embodiment is different from the first embodiment and second embodiment in that a video signal processing unit 12B of a video processing device 10B according to the third embodiment further includes line buffers o-LB and e-LB. The line buffer o-LB is a buffer holding one odd-numbered field and here, it is assumed that the line buffer o-LB holds a "first odd-numbered field" (that is, a first row on the frame).

The line buffer e-LB is a buffer holding one even-numbered field and here, it is assumed that the line buffer e-LB holds a "first even-numbered field" (that is, a second row on the frame).

The video signal processing unit 12B calculates a "video signal difference" between respective video signals held in the line buffers o-LB and e-LB and outputs the video signal difference to a control unit 11B. The video signal processing unit 12B sequentially repeats calculation of the video signal difference like between a "second odd-numbered field" and "a second even-numbered field", between a "third odd-numbered field" and a "third even-numbered field", . . . . The control unit 11B adjusts the predetermined period included in the period information 13a based on such a "video signal difference".

For example, when the "video signal difference" is large enough to exceed a predetermined threshold, the control unit 11B may perform off/on control on the DE signal such that video skipping described up to now is performed (Step S11). The control unit 11B may control the period such that the predetermined period is gradually shortened as the "video signal difference" is increased (Step S12).

This is because the residual image phenomenon becomes easy to occur as the "video signal difference" between the fields is increased. As such, it is possible to suitably prevent the residual image phenomenon while adapting to the level of the "video signal difference" by determining whether video skipping is performed based on the "video signal difference" or not, or by making intervals of the periods shorter as the "video signal difference" is increased. That is, it is possible to more efficiently prevent the residual image phenomenon.

The "video signal difference" may be a difference between the total sums or a difference between average values of respective pixel values in respective image signals held in the respective line buffers o-LB and e-LB. The "video signal difference" is not limited as long as the difference between respective video signals of the line buffers o-LB and e-LB can be recognized.

In FIG. 7A, although a case where the odd-numbered field and the even-numbered field are compared with each other row by row is exemplified, as illustrated in FIG. 7B, line buffers o-LBX and e-LBX capable of holding respective video signal of several rows (five rows in FIG. 7B) may be provided, comparison between the line buffers o-LBX and e-LBX may be performed every several rows, and the "video signal difference" may be calculated. With this, even when the video signal processing unit does not include a frame memory for one frame, if it is assumed that the display area is 480 rows (see FIG. 3) as described above, processing for one frame can be performed by performing comparison of 480÷2÷5=48 times.

As such, in the video processing device 10B according to the third embodiment, the video signal processing unit 12B calculates the video signal difference for each of lines corresponding to fields in the interlace video signal and in a case where the video signal difference calculated by the video signal processing unit 12B exceeds a predetermined threshold, the control unit 11B controls the data enable signal to set the display invalid section of one field.

In a case where the video signal difference calculated by the video signal processing unit 12B exceeds a predetermined threshold, the control unit 11B adjusts the period such that the predetermined period is shortened.

Accordingly, according to the video processing device 10B according to the third embodiment, it is possible to more efficiently prevent the residual image phenomenon.

In the respective embodiments described above, it was assumed that a frame memory corresponding to at least one frame screen is not included. With this, it becomes possible to configure a system at low cost. Accordingly, for example, the embodiments are preferably applied to a product for spreading at a lower price like the product for DA or RSE for on-vehicle.

In the respective embodiments described above, although the data enable signal is controlled such that the display invalid section of one field is set for the interlace video signal at a predetermined period, the number of fields for which the display invalid section is set is at least one field and is not limited. Accordingly, a display invalid section of two or more fields may be set at a predetermined period.

Further effects and a modification example may be easily derived by a person having ordinarily skilled in the art. For that reason, a broader aspect of the present invention is not limited to specific details and representative embodiments as having been described above. Accordingly, various changes may be made without departing from a spirit or a scope of a general inventive concept defined by attached claims and equivalents thereof.

What is claimed is:

1. A video processing device that generates a display video signal to be supplied to a liquid crystal display having a liquid crystal that is driven by a frame inversion scheme, the video processing device comprising:
   a control microcomputer that controls a data enable signal of an interlace video signal that is input to the control microcomputer from outside the control microcomputer, the interlace video signal input to the control microcomputer having a series of fields each of which includes a data signal and a vertical synchronization signal, the control microcomputer controlling the data enable signal such that a display invalid section having a length corresponding to a predetermined number of the fields is set for the interlace video signal at a predetermined period based on the vertical synchronization signal to cause skipping of a video output for one field at the predetermined period to inverse a polarity of an electrode of the liquid crystal display; and a video signal processor that generates the display video signal by setting the display invalid section for the interlace video signal based on the data enable signal controlled by the control microcomputer and outputs the display video signal to the liquid crystal display.

2. The video processing device according to claim 1, further comprising:

a temperature detector that detects a temperature of the liquid crystal display, wherein the control microcomputer adjusts the predetermined period based on a detection result of the temperature detector.

3. The video processing device according to claim 2, wherein the control microcomputer adjusts the predetermined period to gradually shortened as the temperature increases.

4. The video processing device according to claim 1, wherein the control microcomputer controls the data enable signal such that the display invalid section is not set for a non-interlace video signal input from the outside.

5. The video processing device according to claim 1, wherein the video signal processor calculates a video signal difference for each of lines respectively corresponding to each other between fields in the interlace video signal, and in a case where the video signal difference calculated by the video signal processor exceeds a predetermined threshold, the control microcomputer controls the data enable signal to set the display invalid section.

6. The video processing device according to claim 5, wherein the control microcomputer adjusts the predetermined period to gradually shortened as the video signal difference calculated by the video signal processor becomes greater than the predetermined threshold.

7. The video processing device according to claim 1, wherein the predetermined number of the fields is one field.

8. A video display system that displays a video, the video display system comprising:

a liquid crystal display having a liquid crystal that is driven by a frame inversion scheme; and a video processing device that generates a display video signal to be supplied to the liquid crystal display, wherein the video processing device includes a control microcomputer that controls a data enable signal of an interlace video signal that is input to the control microcomputer from outside the control microcomputer, the interlace video signal input to the control microcomputer having a series of fields each of which includes a data signal and a vertical synchronization signal, the control microcomputer controlling the data enable signal such that a display invalid section having a length corresponding to a predetermined number of the fields is set for the interlace video signal at a predetermined period based on the vertical synchronization signal to cause skipping of a video output for one field at the predetermined period to inverse a polarity of an electrode of the liquid crystal display;

a video signal processor that generates the display video signal by setting the display invalid section for the interlace video signal based on the data enable signal controlled by the control microcomputer and outputs the display video signal to the liquid crystal display.

9. A video processing method of generating a display video signal to be supplied to a liquid crystal display having a liquid crystal that is driven by a frame inversion scheme, the method comprising the steps of:

(a) controlling a data enable signal of an interlace video signal that is input from outside, the interlace video signal having a series of fields each of which includes a data signal and a vertical synchronization signal, the data enable signal being controlled such that a display invalid section having a length corresponding to a predetermined number of the fields is set for the interlace video signal at a predetermined period based on the vertical synchronization signal to cause skipping of a video output for one field at the predetermined period to inverse a polarity of an electrode of the liquid crystal display;

(b) generating the display video signal by setting the display invalid section for the interlace video signal based on the data enable signal that has been controlled and outputting the display video signal to the liquid crystal display.

10. The video processing method according to claim 9, further comprising the step:

(c) detecting a temperature of the liquid crystal display, wherein the step (a) adjusts the predetermined period based on a detection result of the step (c).

11. The video processing method according to claim 10, wherein the step (a) adjusts the predetermined period to gradually shortened as the temperature increases.

12. The video processing method according to claim 9, wherein the step (a) controls the data enable signal such that the display invalid section is not set for a non-interlace video signal input from the outside.

13. The video processing method according to claim 9, wherein the step (b) calculates a video signal difference for each of lines respectively corresponding to each other between fields in the interlace video signal, and the step (a) controls the data enable signal to set the display invalid section in a case where the video signal difference calculated by the step (b) exceeds a predetermined threshold.

14. The video processing method according to claim 13, wherein the step (a) adjusts the predetermined period to gradually shortened as the video signal difference calculated by the step (b) becomes greater than the predetermined threshold.

15. The video processing method according to claim 9, wherein the predetermined number of the fields is one field.

* * * * *